(12) United States Patent
Schmidt et al.

(10) Patent No.: US 8,599,861 B2
(45) Date of Patent: Dec. 3, 2013

(54) ACTIVE ANTENNA ARRAY AND METHOD FOR RELAYING RADIO SIGNALS

(75) Inventors: Georg Schmidt, Laichingen (DE); Johannes Schlee, Ulm (DE)

(73) Assignee: KATHREIN-Werke KG, Rosenheim (DE)

( * ) Notice: Subject to any disclaimer, the term of this patent is extended or adjusted under 35 U.S.C. 154(b) by 482 days.

(21) Appl. No.: 12/792,936

(22) Filed: Jun. 3, 2010

(65) Prior Publication Data
US 2011/0299456 A1  Dec. 8, 2011

(51) Int. Cl.
*H04L 12/28* (2006.01)
*H04L 12/56* (2011.01)
*H01Q 19/10* (2006.01)

(52) U.S. Cl.
USPC .......... 370/395.62; 370/278; 370/310.2; 370/328; 342/74; 342/383; 342/384; 375/303; 375/304; 375/307; 375/334; 343/757; 343/782; 343/832; 343/840

(58) Field of Classification Search
USPC ......... 370/277, 278, 310.2, 328, 334, 395.62, 370/339; 342/74, 359–360, 380–386; 375/295–352; 343/745–782, 828–843
See application file for complete search history.

(56) References Cited

U.S. PATENT DOCUMENTS

| | | | |
|---|---|---|---|
| 6,292,135 B1* | 9/2001 | Takatori et al. | 342/383 |
| 6,693,588 B1 | 2/2004 | Schlee | |
| 6,823,001 B1* | 11/2004 | Chea | 375/219 |
| 6,944,188 B2* | 9/2005 | Sinha et al. | 370/503 |
| 7,483,450 B1* | 1/2009 | Giese et al. | 370/507 |
| 7,558,348 B1* | 7/2009 | Liu et al. | 375/346 |
| 2003/0236107 A1 | 12/2003 | Azuma | |
| 2004/0151506 A1 | 8/2004 | Shiramizu et al. | |
| 2005/0047495 A1 | 3/2005 | Yoshioka | |
| 2006/0105715 A1 | 5/2006 | Kodani et al. | |
| 2006/0286940 A1* | 12/2006 | Izumi et al. | 455/78 |
| 2008/0007453 A1* | 1/2008 | Vassilakis et al. | 342/368 |
| 2010/0093282 A1* | 4/2010 | Martikkala et al. | 455/63.4 |

(Continued)

FOREIGN PATENT DOCUMENTS

| | | |
|---|---|---|
| EP | 1120858 | 4/2007 |
| EP | 1983660 | 10/2008 |
| KR | 1020050089853 | 9/2005 |

OTHER PUBLICATIONS

International Search Report issued in PCT/EP2011/058454 on Sep. 29, 2011.
"Common Public Radio Interface (CPRI); Interface Specification", XP-002632189, Oct. 20, 2006, 87 pages.
International Preliminary Report issued in PCT/EP11/58454 on Dec. 13, 2012.

(Continued)

*Primary Examiner* — Benjamin H Elliott, IV
(74) *Attorney, Agent, or Firm* — Stephen H. Eland; Dann, Dorfman, Herrell & Skillman

(57) ABSTRACT

The present disclosure teaches an active antenna array for a mobile communications network. The active antenna array comprises a base band unit, a plurality of transceiver units terminated by at least one antenna element; and at least one link. The link couples the individual ones of the plurality of transceiver units to the base band unit. The link is a digital link and is adapted to relay a payload signal at a selectable payload rate. The digital link is further adapted to relay a timing signal at a fixed timing rate, when the timing signal is embedded in the payload at a selectable payload rate. The present disclosure further teaches a method for relaying radio signals and a computer program for manufacturing the active antenna array and for executing the method.

15 Claims, 12 Drawing Sheets

(56) References Cited

U.S. PATENT DOCUMENTS

| | | |
|---|---|---|
| 2010/0166109 A1* | 7/2010 | Neumann et al. ............. 375/296 |
| 2011/0051847 A1* | 3/2011 | Flury et al. .................... 375/316 |
| 2011/0159809 A1* | 6/2011 | Kenington ...................... 455/20 |
| 2011/0299430 A1* | 12/2011 | Schmidt et al. ............... 370/277 |
| 2011/0299456 A1* | 12/2011 | Schmidt et al. ............... 370/328 |

OTHER PUBLICATIONS

"Common Public Radio Interface (CPRI); Interface Specification", XP-002632189, Oct. 20, 2006, 89 pages.

U.S. Appl. No. 12/577,339 entitled: "Radio System and Method for Relaying Radio Signals", filed Oct. 12, 2009.

\* cited by examiner

ACTIVE ANTENNA ARRAY AND METHOD FOR RELAYING RADIO SIGNALS

CROSS REFERENCE TO OTHER APPLICATIONS

The present application is related to U.S. patent application Ser. No. 12/577,339 entitled "A RADIO SYSTEM AND A METHOD FOR RELAYING RADIO SIGNALS", filed Oct. 12, 2009. The present application is also related to U.S. patent application Ser. No. 12/792,925 entitled "ACTIVE ANTENNA ARRAY AND METHOD FOR RELAYING RADIO SIGNALS WITH SYNCHRONOUS DIGITAL DATA INTERFACE", filed Jun. 3, 2010. The entire disclosure of each of the foregoing patent applications is incorporated herein by reference.

FIELD OF THE INVENTION

The field of the present invention relates to an active antenna array for relaying radio signals. The field of the present invention further relates to a method for relaying radio signals in a mobile communications network. Furthermore, the field of the present invention relates to a computer program product enabling a foundry to carry out the manufacture of the active antenna array and a computer program product enabling a processor to carry out the method for relaying radio signals in a mobile communications network.

BACKGROUND OF THE INVENTION

The use of mobile communications networks has increased over the last decade. Operators of mobile communications networks have increased the number of base stations in order to meet an increased request for service by users of the mobile communications network. The base stations are typically coupled to an (active) antenna array. The radio signals are typically relayed into a cell of the mobile communications network, and vice versa. It is of interest for the operator of the mobile communications network to reduce the running costs of the base stations. It is one option to implement the radio system as an antenna embedded radio system. With the antenna embedded radio system formed as active antenna array some of the hardware components of the radio system may be implemented on a chip. The active antenna array therefore reduces the costs of the base station. Implementing the radio system as the antenna embedded radio system reduces space needed to house the hardware components of the base station. Power consumption during normal operation of the radio system is substantially reduced when implementing the antenna embedded radio system.

It is of interest to provide a reliable quality of service to an individual user of the mobile communications network given the increase in the number of users. Several techniques have been suggested in order to deal with the increased number of users within the mobile communications network. One of the several techniques comprises beam forming capabilities in order to direct a beam relayed by the active antenna array in different directions to improve service coverage within the cells of the mobile communications network. The beam forming techniques rely on defined phase and amplitude relations between several ones the antenna elements of the active antenna array. A transmit path and/or a receive path is associated with at least one antenna element. Calibration of the transmit paths and/or the receive paths is required to provide the defined phase, amplitude and delay relationship between the individual ones of the antenna elements. The calibration allows the estimation of a phase, amplitude and delay deviation accumulated along individual transmit paths of the active antenna array. Likewise the calibration comprises estimating phase, amplitude and delay deviations accumulated along individual ones of the receive paths. In a second step the phase, amplitude and delay deviation accumulated along the transmit paths can be corrected. An appropriate phase and amplitude change may be applied to the individual transmit/receive paths to yield the defined phase and amplitude relationship between the individual transmit/receive paths of the active antenna array, in order to allow for beam forming techniques.

In a modern mobile communications network a payload signal is provided as a packetized payload signal to the active antenna array. Packets of the packetized payload signal have a defined temporal order when the packetized payload signal is provided to the digital radio interface. Within the active antenna array some (data) processing may be applied to the packetized payload signal. The (data) processing typically comprises the packetized payload signal passing through several buffers and clock domains that are synchroized by PLLs. With the data processing the timing of the packet stream may change each time the system is restarted (reset). In the prior art, with non-packetized signals, it was possible and common practise to calibrate the transmit paths along which the non-packetized payload signal travels when being relayed by the radio station during manufacture of the radio station.

A delay experienced by a radio signal reaching the digital radio interface until a corresponding radio signal is relayed by antenna elements of the active antenna array is of interest for a coherent relaying of the active antenna array. The delay affects a phase relation between individual ones of the antenna elements as well as position based services. The delay is affected by any change in cable length and the like.

In the prior art it was necessary to recalibrate the active antenna array whenever a component of the active antenna array, for example, a cable, was replaced. The recalibration in the prior art is expensive and time consuming.

U.S. Pat. No. 6,693,588 B1 (assigned to Siemens) discloses an electronically phase-controlled group antenna. The electronically phase-controlled group antenna is calibrated using a reference point shared by all of reference signals. In the downlink, those reference signals which can be distinguished from one another are simultaneously transmitted by individual antenna elements of the group antenna and are suitably separated after reception at the shared reference point.

The Siemens system of U.S. '588 discloses a fixed spatial arrangement of the antenna elements.

FIG. 1a shows a passive antenna array 1a according to the prior art. A base station 5 provides a base station signal 7 to the passive antenna array 1a. A digital interface carries the base station signal 7 between the base station 5 and a central base band processing unit 10 of the passive antenna array 1a. The central base band processing unit 10 forwards a transmit signal Tx to a power amplifier 60 in order to amplify the transmit signal Tx. It is to be understood that the transmit signal Tx is typically provided in a transmit band of the mobile communication system. The signal leaving the central base band unit 10 is a transmit signal in the analogue domain. The transmit signal Tx entering the amplifier 60 requires an up-converting into a transmit band of the passive antenna array 1a. The transmit signal Tx will further require a digital-to-analogue conversion, if the transmit signal Tx is in the digital domain. The digital-to-analogue conversion is then carried out by a digital-to-analogue converter (not shown) prior to the amplification by the amplifier 60. The analogue transmit signal leaving the amplifier 60 is forwarded to individual transmit paths. Each of the transmit paths comprises a duplex filter 25-1, 25-2, . . . , 25-N forwarding the analogue transmit signals to an individual one of the antenna elements 85-1, 85-2, . . . , 85-N. It is to be noted that more than one individual antenna element 85-1, 85-2, . . . , 85-N may be coupled to an individual one of the duplex filters 25-1, 25-2, . . . , 25-N. Before entering the individual duplex filters 25-1, 25-2, . . . , 25-N the analogue transmit signal passes through a passive feeder network 40a. The passive feeder network 40a imposes a fixed phase, amplitude and/or delay relation between individual ones of the transmit paths terminated by the individual ones of the antenna elements 85-1, 85-2, . . . , 85-N. The passive feeder network 40a provides only little flexibility in terms of beam shaping. Any change of components within the passive feeder network 40a will require a recalibration of the paths from the amplifier 60 to the individual ones of the duplex filters 25-1, 25-2, . . . , 25-N. It is to be understood that individual ones of the transmit paths run from the amplifier 60 across the passive feeder network 40a and an individual one of the duplex filters 25-1, 25-2, . . . , 25-N and are terminated by an individual one of the antenna elements 85-1, 85-2, . . . , 85-N.

Individual receive paths of the passive antenna array 1a run from the individual antenna elements 85-1, 85-2, . . . , 85-N via the duplex filters 25-1, 25-2, . . . , 25-N and the passive feeder network 40a reaching a receive amplifier 70 as a general receive signal Rx. The general receive signal Rx is formed from individual receive signals received at the antenna elements 85-1, 85-2, . . . , 85-N combined by the passive feeder network 40a. The feeder network 40a imposes a fixed phase, amplitude and delay relation between the receive signals received at individual ones of the antenna elements 85-1, 85-2, . . . , 85-N. Therefore beam forming capabilities for the individual receive signals are limited by the passive feeder network 40a.

The receive signal Rx is in the analogue domain. Individual receive signals from the antenna element may have undergone a filtering by the duplex filters 25-1, 25-2, . . . , 25-N as is known in the art. The receive signal Rx is amplified by the receive amplifier 70 and analogue-to-digital transformed using an analogue-to-digital converter (not shown), for example, a sigma-delta analogue-to-digital converter. The signal reaching the central base band processing unit 10 from the receive amplifier 70 is typically in the base band of the passive antenna array 1a. The receive signal from the receive amplifier 70 may be in an intermediate frequency band between a base band of the passive antenna array 1a and a transmit band of the passive antenna array 1a. The central base band processing unit 10 may impose some digital signal processing such as filtering to the digital receive signal and forwards the digital receive signal in the base band to the base station 5.

FIG. 1b shows a variant of the active antenna array 1a according to the prior art. A system as depicted in FIG. 1b is typically equivalent to combining a prior art remote radio head (RRH) with a known base station antenna within a common housing. The base station signal 7 comprises the receive signal from the central base band processing unit 10 being forwarded to the base station 5. In FIG. 1b the duplex filters 25-1, 25-2, . . . , 25-N of the individual transmit paths of FIG. 1a are replaced by a single duplexer 25. It will be appreciated that the system of FIG. 1b is more cost-efficient than the system depicted in FIG. 1a.

The transmit signals and the received signal between the base station 5 and the central base band processing unit 10 are forwarded along a digital interface. The transmit signals and/or the receive signals may be provided in an in phase component I and a quadrature component Q. The in phase component I and the quadrature component Q may be provided according to a standard format set by the open base station architecture interface (OBASI) or in a common protocol radio interface (CPRI) format, but are not limited thereto.

FIG. 2 shows an active antenna array 1a according to the prior art. The active antenna array 1a of FIG. 2 does not comprise the passive feeder network 40a as shown in FIG. 1. Instead the antenna elements 85-1, 85-2, . . . , 85-N are terminating transceiver units 20-1, 20-2, . . . , 20-N. The transceiver units 20-1, 20-2, . . . , 20-N comprise amplifiers 60-1, 60-2, . . . , 60-N for each one of the transceiver units 20-1, 20-2, . . . , 20-N. Likewise the transceiver units 20-1, 20-2, . . . , 20-N comprise an individual receive amplifiers 70-1, 70-2, . . . , 70-N for each one of the transceiver units 20-1, 20-2, . . . , 20-N. The central base band processing unit 10 forwards individual transmit signals Tx-1, Tx-2, . . . , Tx-N from the central base band unit 10 to the individual amplifiers 60-1, 60-2, . . . , 60-N. The individual transmit signals Tx-1, Tx-2, . . . , Tx-N are typically in the analogue domain and in the transmit band of the active antenna array 1a. A digital to analogue conversion is typically carried out by the central base band processing unit 10, as explained above. The receive signal received at the individual antenna elements 85-1, 85-2, . . . , 85-N are amplified at the individual receive amplifiers 70-1, 70-2, . . . , 70-N and forwarded as individual receive signals Rx-1, Rx-2, . . . , Rx-N to the central base band processing unit 10. The individual receive signals Rx-1, Rx-2, . . . , Rx-N are combined by the central base band processing unit 10. The combining of the individual receive signals Rx-1, Rx-2, . . . , Rx-N is carried out in the base band domain. The individual receive signals Rx-1, Rx-2, . . . , Rx-N are in the analogue domain. The central base band processing unit 10 typically performs an analogue-to-digital conversion. The central base band processing unit 10 combines the individual receive signals Rx-1, Rx-2, . . . , Rx-N into a global receive signal, the global receive signal is typically forwarded to the base station 5.

The individual transmit signal Tx-1, Tx-2, . . . , Tx-N is in the analogue domain and the transmit band of the active antenna array 1a. The individual transmit signals Tx-1, Tx-2, . . . , Tx-N are generated by the central base band processing unit 10. The splitting into the individual transmit signal Tx-1, Tx-2, . . . , Tx-N may be carried out in a digital domain or in the analogue domain. The active antenna array 1a as depicted in FIG. 2 is known from phased array antennas used for example in RADAR applications or in magnetic resonance imaging.

The phased array antenna 1a can as well be formed in the receive case. Individual receive signals Rx-1, Rx-2, . . . , Rx-N are amplified by individual receive amplifiers 70-1, 70-2, . . . , 70-N and combined by the central base band processing unit 10 into a general receive signal. The combining into the general receive signal may be carried out in a digital domain and/or in the analogue domain. However, in order to operate such phased arrays, i.e. the active antenna array 1a as depicted in FIG. 2, phase, amplitude and delay relations between individual ones of the transceiver units 20-1, 20-2, . . . , 20-N need to be carefully calibrated in order to achieve an intended beam relayed by the active antenna array 1a. If the implementation of the active antenna array 1a is built up substantially in the analogue domain, the calibration of the active antenna array 1a is difficult and known solutions are often bulky and expensive.

SUMMARY OF THE INVENTION

The present invention relates to an active antenna array for a mobile communications network. The active antenna array comprises a base band unit, a plurality of transceiver units and at least one link. The base band unit is coupled to a base station 5. The plurality of transceiver units is terminated by at least one antenna element. Hence an individual one of the transceiver units may be terminated by more than one of the antenna elements. The at least one link couples the individual ones of the plurality of transceiver units to the base band unit. The at least one link is a digital link and is adapted to relay a payload signal at a selectable payload rate. The at least one link is further adapted to relay a timing signal at a fixed timing rate. The timing signal T is embedded in the pilot signal at the selectable payload rate.

The present invention further relates to a method for relaying radio signals in a mobile communications network. The method comprises a generating of a global timing signal at a fixed timing rate. The global timing rate is generated in response to a payload signal received from a base station. The method comprises an embedding of the global timing signal in at least one payload signal at a selectable payload rate. The method further comprises a forwarding of the at least one payload signal over at least one link. The method further comprises a step of extracting at least one local timing signal for at least one transceiver unit from the global timing signal. The method further comprises relaying the at least one payload signal according to an individual one of the local timing signals. The selectable payload rate is selectable independently from the next timing rate.

The present disclosure further relates to a computer program product comprising a non-transitory computer useable medium, have a control logic stored therein for causing a computer to manufacture the active antenna array for a mobile commun network of the present disclosure.

The present disclosure further relates to a computer program product comprising a non-transitory computer useable medium, have a control logic stored therein for causing a computer to relay radio signals in a mobile communications network as disclosed according to the present disclosure.

DETAILED DESCRIPTION OF THE INVENTION

The invention will now be described on the basis of the drawings. It will be understood that the embodiments and aspects described herein are only examples and do not limit the protective scope of the claims in any way. The invention is defined by the claims and their equivalents. It will also be understood that features of one aspect can be combined with features of a different aspect.

Figure 1A:
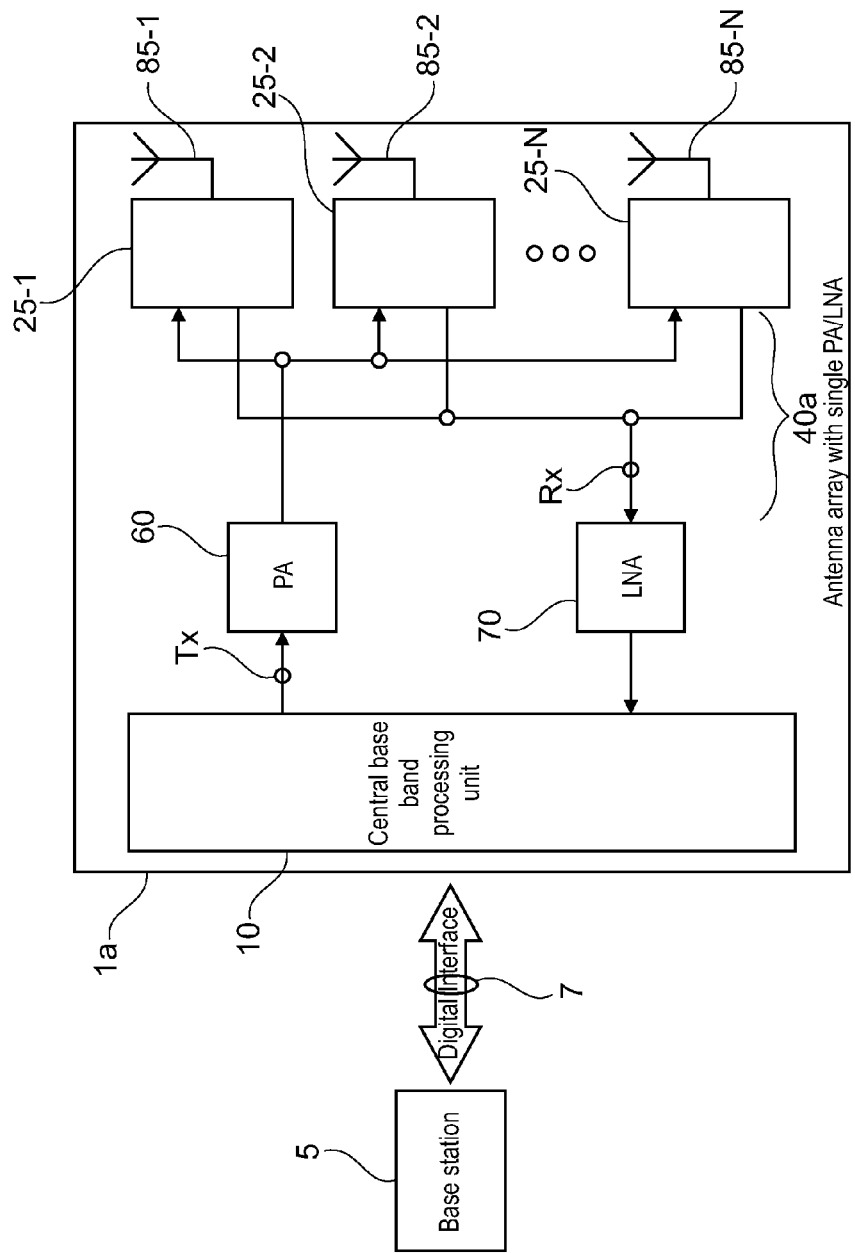
FIG. 1*a* shows an active antenna array of the prior art.
Figure 1B:
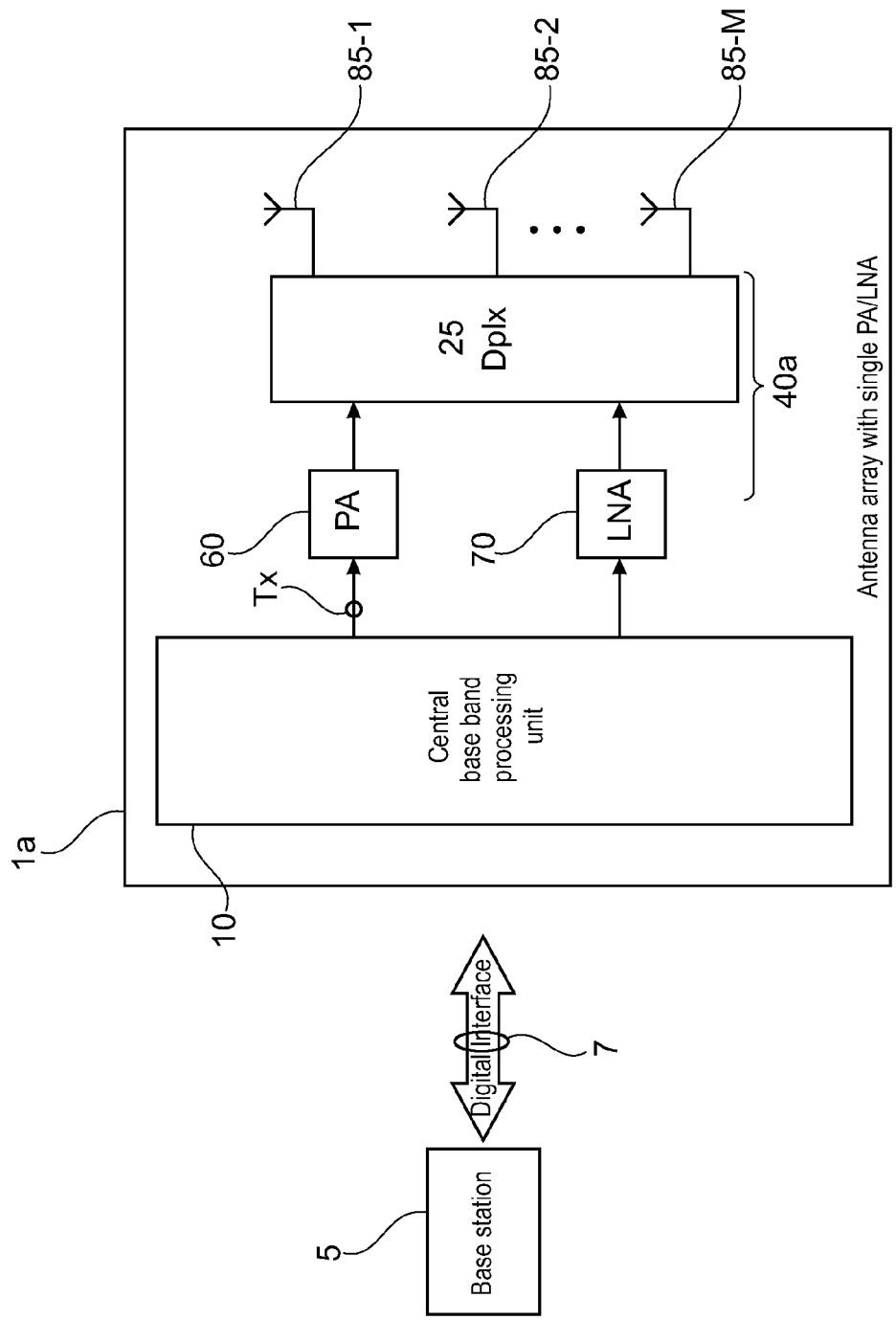
FIG. 1*b* shows a variant of the active antenna array of the prior art.
Figure 2:
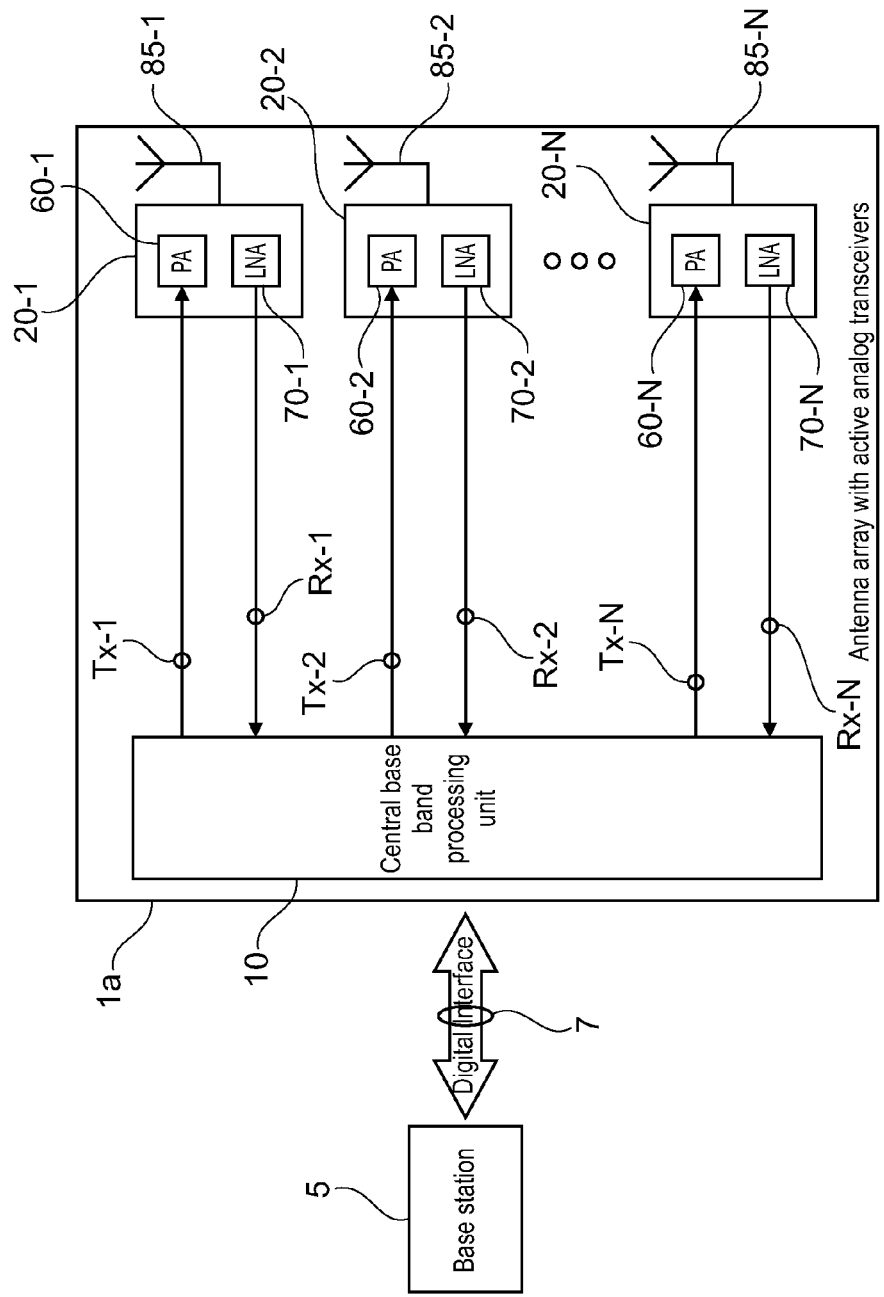
FIG. 2 shows another aspect of an active antenna array according to the prior art.
Figure 3:
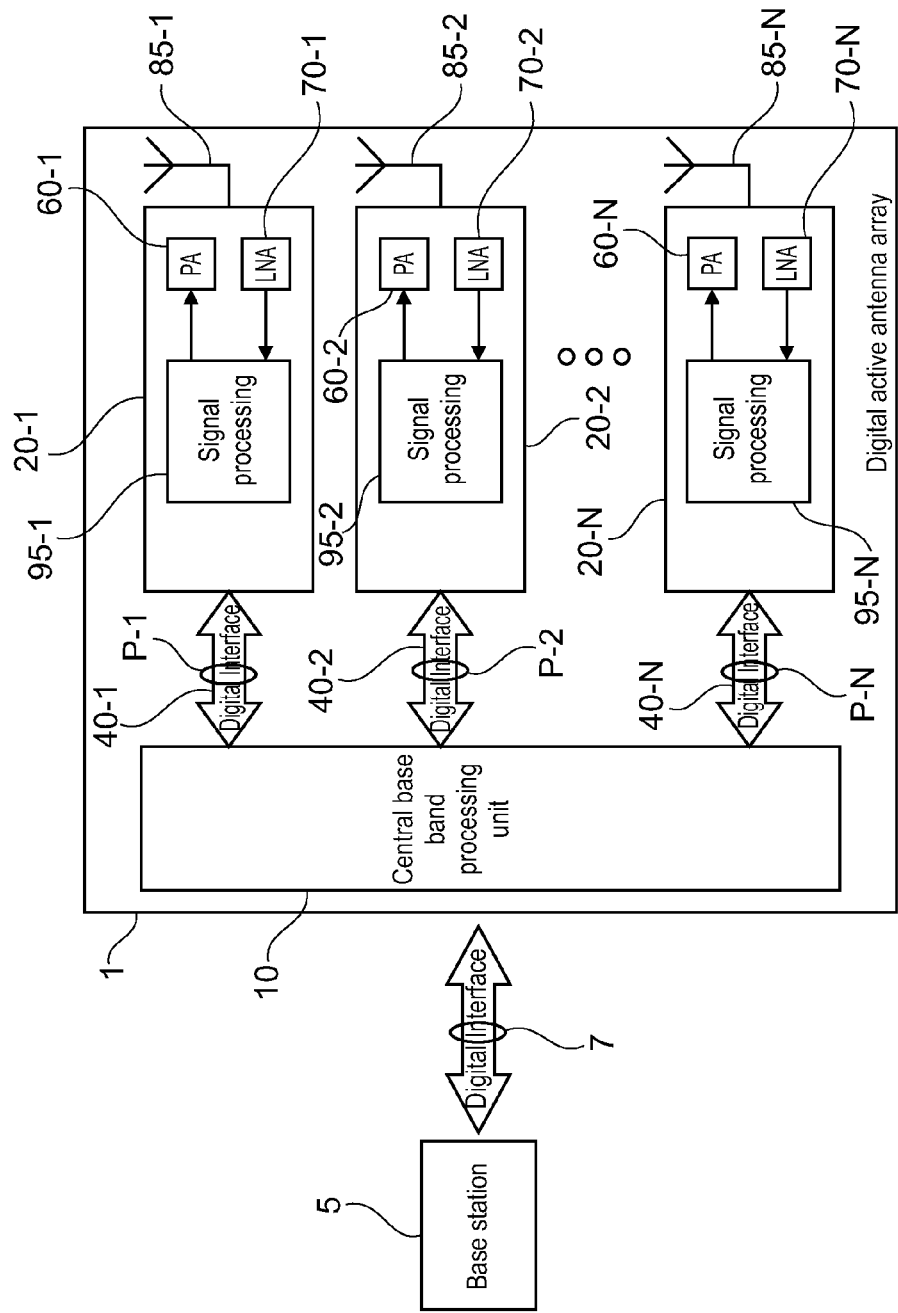
FIG. 3 shows a first aspect of the active antenna array.

FIG. 3 shows an active antenna array 1 according to the present disclosure. The active antenna array 1 is different from the active antenna array 1*a* of the state of the art (see FIGS. 1 and 2) in that the transceiver units 20-1, 20-2, . . . , 20-N comprise individual clocks as will be explained below. In FIG. 3 a link 40-1, 40-2, . . . , 40-N couples the central base band processing unit or a base band unit 10 to individual ones of the transceiver units 20-1, 20-2, . . . , 20-N. Hence an individual transmit signal Tx-1, Tx-2, . . . , Tx-N is forwarded to the transceiver units 20-1, 20-2, . . . , 20-N is no longer in the analogue domain (as known from FIGS. 1 and 2). Likewise an individual receive signal from the transceiver units 20-1, 20-2, . . . , 20-N is also in the digital domain when being forwarded to the central base band processing unit 10. The link 40-1, 40-2, . . . , 40-N is a digital link. The link 40-1, 40-2, . . . , 40-N between the central base band processing unit 10 and the transceiver units 20-1, 20-2, . . . , 20-N is asynchronous. Data is exchanged using a variable length of data frames or packet sizes. There is no constant bit stream synchronised with a digital payload signal or the base station signal 7.

Each one of the links 40-1, 40-2, . . . , 40-N relays an individual payload signal P-1, P-2, . . . , P-N at a selectable payload rate Pr. The selectable payload rate may be implemented using variable packet sizes. The base station 5 forwards a data stream comprising the base station signal 7 being typically at a constant sampling rate. The payload rate Pr for an individual one of the links 40-1, 40-2, . . . , 40-N can be selected. The payload rate Pr may vary over time for the individual one of the links 40-1, 40-2, . . . , 40-N, as will be explained next.

A first packet may be relayed over the individual one of the links 40-1, 40-2, . . . , 40-N with a first packet size and a second packet may be relayed over the same individual one of the links 40-1, 40-2, . . . , 40-N at a second packet size. Therefore fractions of a maximum payload rate across the links 40-1, 40-2, . . . , 40-N are also implementable. The fractions of the maximum payload rate can be implemented using different packet sizes. The links 40-1, 40-2, . . . , 40-N allow a burst-type of transmission when using the different packet sizes. The maximum payload rate may be 2.4 Gb/s across the link 40-1, 40-2, . . . , 40-N but is not limited thereto. The maximum payload rate and the fractions of the maximum payload rate across the links 40-1, 40-2, . . . , 40-N can be exploited, when relaying radio signals according to more than one protocol with the active antenna array 1.

The base station signals 7 comprise a well defined temporal order of data frames or data packets over the digital interface reaching the central base band processing unit 10. Along the link 40-1, 40-2, . . . , 40-N, the payload rate of the individual payload signals P-1, P-2, . . . , P-N is variable and is therefore not necessarily reflecting the temporal order of the base station signals 7 across the digital interface. The burst-type transfer across the links 40-1, 40-2, . . . , 40-N may introduce or remove delays present in the base station signal 7 and hence hamper the temporal order of the base station signal 7. It is of interest to restore the temporal order of the digital data packets on the individual ones of the transceiver units 20-1, 20-2, . . . , 20-N for a coherent relaying of the active antenna array 1.

It is to be understood that the individual payload signal P-1, P-2, . . . , P-N comprises individual transmit signals Tx-1, Tx-2, . . . , Tx-N in the digital domain. The individual payload signal P-1, P-2, . . . , P-N further comprises individual receive signals Rx-1, Rx-2, . . . , Rx-N in the digital domain. In the active antenna arrays 1a of FIGS. 1 and 2 digital-to-analogue converting together with any further signal processing was performed by the central base band processing unit 10. The active antenna array 1 of FIG. 3 comprises processing elements 95-1, 95-2, . . . , 95-N. The processing elements 95-1, 95-2, . . . , 95-N are adapted to perform a signal processing on digital signals and/or forming digital signal(s) from analogue signals. The processing elements 95-1, 95-2, . . . , 95-N can be a digital filtering element, an analogue filtering element, a duplex filter, digital-to-analogue converter, an analogue-to-digital converter, an equalizer, a mixer but is not limited thereto.

The variable payload rate Pr of the individual payload signals P-1, P-2, . . . , P-N does not require a clock on the links 40-1, 40-2, . . . , 40-N. The present disclosure teaches a distributed, flexible clocking scheme not requiring the modification of a clock generator frequency, the transceiver units 20-1, 20-2, . . . , 20-N or the central base band processing unit 10 when varying the payload rate Pr. Therefore the active antenna array 1 provides a high degree of flexibility in varying individual ones of the payload rate Pr for the individual payload signals P-1, P-2, . . . , P-N. Changing the payload rate Pr does not require any modifications in the clock generator frequencies, the transceiver units 20-1, 20-2, . . . , 20-N or the central base band processing unit 10.

The embedding of a global timing signal T in the payload signals p-P-1, p-P-2, . . . , p-P-N at the selectable payload rate Pr may be achieved by encoding the global timing signal T such that rising and/or falling edges of the global timing signal T are substantially occurring at a defined frequency, representing the timing rate Tr.

A synchronisation of timing between the central processing unit 10 and the individual transceiver units 20-1, 20-2, . . . , 20-N is performed using the global timing signal T embedded in the base station signal 7. The global timing signal T is embedded into the individual payload signals p-P-1, p-P-2, . . . , p-P-N across the links 40-1, 40-2, . . . , 40-N.

Figure 4:
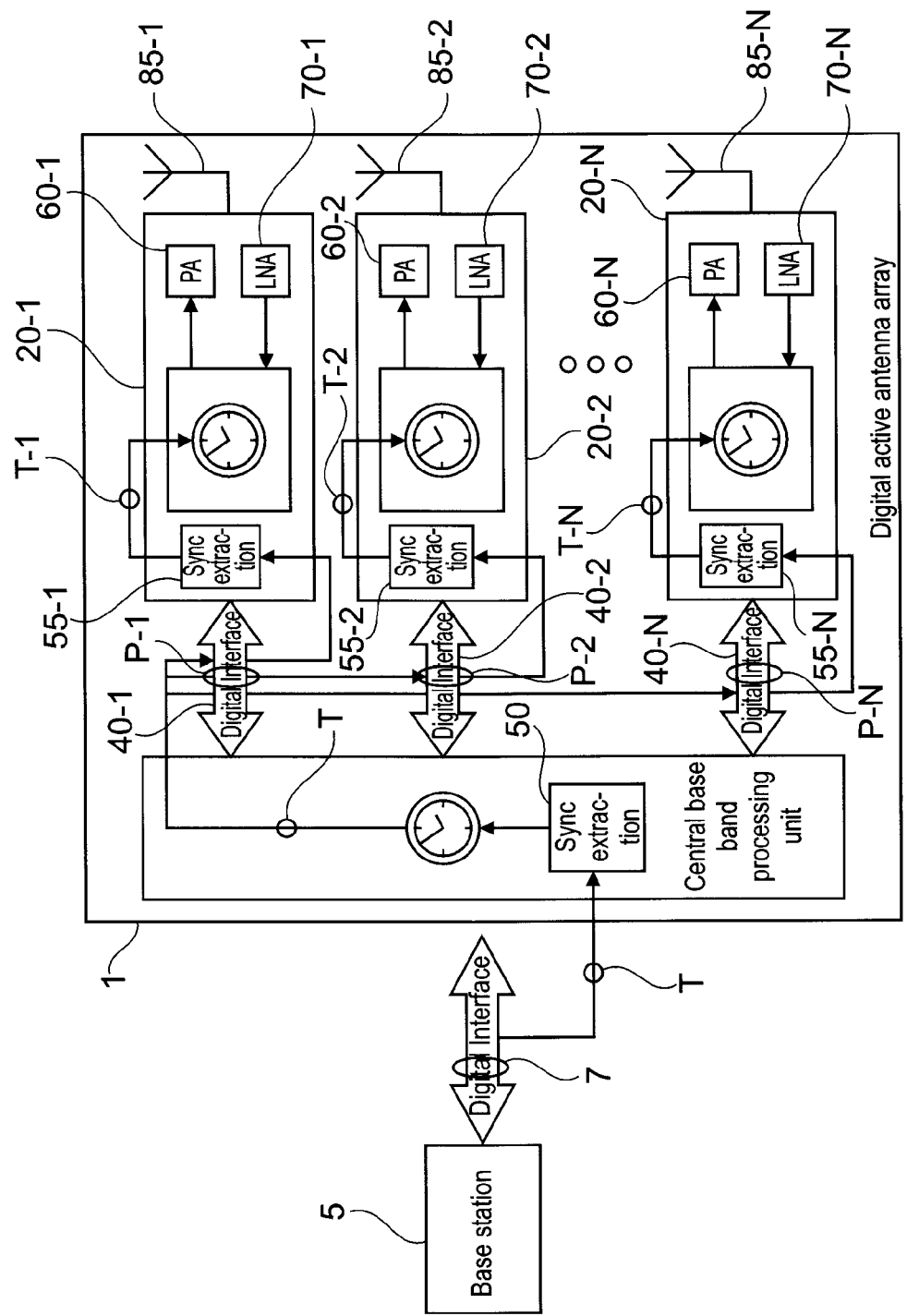
FIG. 4 shows another aspect of the active antenna array.

FIG. 4 discloses the synchronisation of individual timing signals T-1, T-2, . . . , T-N for each one of the transceiver units 20-1, 20-2, . . . , 20-N in more detail. The timing signal T is typically provided at a fixed timing rate Tr. The timing signal T is extracted by a central clocking unit 50 from the base station signal 7. The central clocking unit 50 forwards the timing signal T to the links 40-1, 40-2, . . . , 40-N. More precisely the timing signal T is embedded into the data packages of variable payload rate Pr of the individual payload signals P-1, P-2, . . . , P-N.

The transceiver units 20-1, 20-2, . . . , 20-N comprise local timing units 55-1, 55-2, . . . , 55-N. The local timing units 55-1, 55-2, . . . , 55-N are adapted to extract local timing signals T-1, T-2, . . . , T-N from the individual payload signal P-1, P-2, . . . , P-N send across the link 40-1, 40-2, . . . , 40-N.

It is to be understood that the local timing units 55-1, 55-2, . . . , 55-N know the timing rate Tr of the global timing signal T. In combination with a buffer (not shown) the temporal order of the data packets being relayed along the links 40-1, 40-2, . . . , 40-N may be restored using the local timing signals T-1, T-2, . . . , T-N extracted by the local timing units 55-1, 55-2, . . . , 55-N. Therefore the temporal order of the digital base station signal 7 may be restored for each one of the transceiver units 20-1, 20-2, . . . , 20-N.

The distributed clock synchronisation concept described in this disclosure enables each of the transceiver units 20-1, 20-2, . . . , 20-N to be synchronised to the central clocking unit 50 of the base band processing unit 10. Under perfect conditions the distributed clock synchronisation simultaneously yields a synchronisation between all the transceiver units 20-1, 20-2, . . . , 20-N. However, the distributed clock synchronisation may be hampered between individual ones of the transceiver units 20-1, 20-2, . . . , 20-N due to different cable lengths, start-up effects of digital components, such as buffers, analogue component tolerances, such as variations in group delay and the like. All these effects could cause a time delay, an amplitude and a phase to vary between individual ones of the transceiver units 20-1, 20-2, . . . , 20-N.

Means are known in the art for measuring the phase deviation, the amplitude deviation and delay deviations between the individual transceiver units 20-1, 20-2, . . . , 20-N as well as techniques for compensating the phase deviations, the amplitude deviations and the delay deviations between individual ones of the transceiver units 20-1, 20-2, . . . , 20-N due to imperfections of the transceiver units 20-1, 20-2, . . . , 20-, as will be explained next. It is known that the phase deviation, the amplitude deviation and the time deviation can be measured using a pilot signal and/or by blind methods. The blind methods comprise comparing the payload signal from the base station signal 7 with the payload signal beam actually relayed at the antenna elements 85-1, 85-2, . . . , 85-N. In the digital domain correlation methods may be implemented as described in the related U.S. patent application Ser. No. 12/577,339 filed on 1 Apr. 2009.

Figure 5:
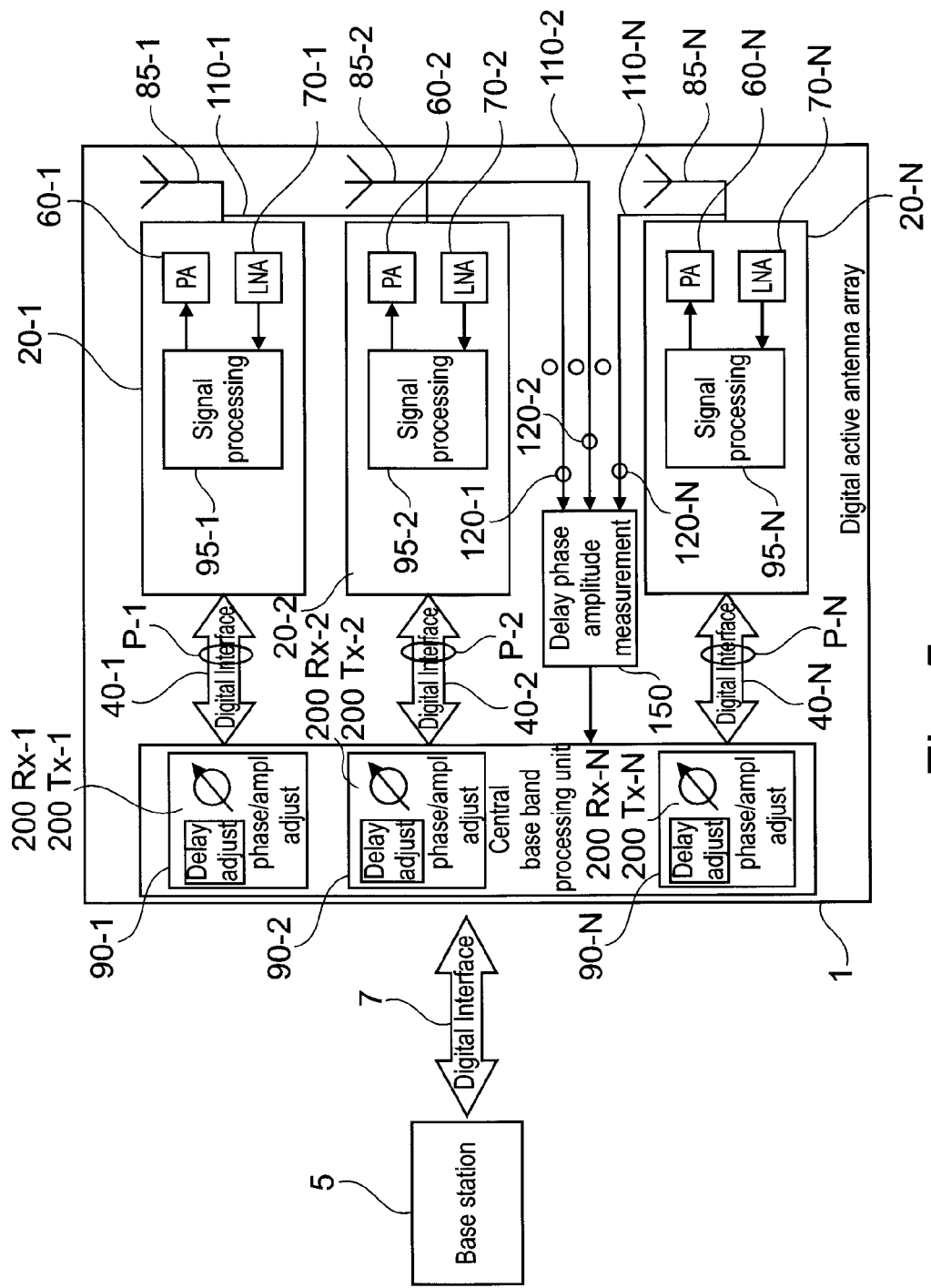
FIG. 5 shows the active antenna array 1 comprising a feedback path.

FIG. 5 shows an aspect of the active antenna array 1 comprising feedback paths 110-1, 110-2, . . . , 110-N from the antenna elements 85-1, 85-2, . . . , 85-N to a measurement unit 150. The feedback paths 110-1, 110-2, . . . , 110-N relays feedback signals 120-1, 120-2, . . . , 120-N. The feedback signal 120-1, 120-2, . . . , 120-N comprises a coupled transmit signal 120Tx-1, 120Tx-2, . . . , 120Tx-N for a calibration of the transmit signal of the transceiver units 20-1, 20-2, . . . , 20-N. The coupled transmit signal 120Tx-1, 120Tx-2, . . . , 120Tx-N comprises a small portion of a signal transmitted by the antenna elements 85-1, 85-2, . . . , 85-N. Means for extracting the coupled transmit signal 120Tx-1, 120Tx-2, . . . , 120Tx-N comprise a directional coupler (not shown) but are not limited thereto. The feedback signal 120-1, 120-2, . . . , 120-N further comprises a coupled receive signal 120Rx-1, 120Rx-2, . . . , 120Rx-N corresponding to a small portion of a receive signal received at the antenna elements 85-1, 85-2, . . . , 85-N. A comparison between the payload signal within the base station signal 7 entering the central base band processing unit 10 and the coupled transmit signal 120Tx-1, 120Tx-2, . . . , 120Tx-N allows the calculation of transmit deviations Tx-1, Tx-2, . . . , Tx-N. The transmit deviations Tx-1, Tx-2, . . . , Tx-N comprise a transmit phase deviation, an transmit amplitude deviation and a transmit time delay. The transmit deviations Tx-1, Tx-2, . . . , Tx-N describe an amount of temporal misalignment between individual ones of the transceiver units 20-1, 20-2, . . . , 20-N when transmitting.

A comparison of the coupled receive signals 120Rx-1, 120Rx-2, . . . , 120Rx-N and the receive signal within the base station signal 7 leaving the central base band processing unit 10 provides receive deviations Rx-1, Rx-2, . . . , Rx-N between the individual ones of the transceiver units 20-1, 20-2, . . . , 20-N. The receive deviations Rx-1, Rx-2, . . . , Rx-N comprise a receive phase variation, a receive amplitude variation and a receive delay variation. The receive deviations Rx-1, Rx-2, . . . , Rx-N and/or the transmit deviations Tx-1, Tx-2, . . . , Tx-N are measured at the measurement unit 150. The transmit deviation Tx-1, Tx-2, . . . , Tx-N and/or the receive variations Rx-1, Rx-2, . . . , Rx-N are forwarded to the central base band processing unit 10.

The adjustment units 90-1, 90-2, ..., 90-N are adapted to impose base compensations, amplitude compensations and delay compensations in order to yield a coherent relaying of the active antenna array 1. The adjustment units 90-1, 90-2, ..., 90-N are adapted to apply transmit compensations 200Tx-1, 200Tx-2, ..., 200Tx-N to the payload signals P-1, P-2, ..., P-N before entering the links 40-1, 40-2, ..., 40-N. The transmit compensations 200Tx-1, 200Tx-2, ..., 200Tx-N may comprise a transmit phase compensation, a transmit amplitude compensation and a transmit delay compensation. Applying the transmit compensations 200Tx-1, 200Tx-2, ..., 200Tx-N will substantially correct the transmit deviations Tx-1, Tx-2, ..., Tx-N. Hence a transmission of the active antenna array 1 will be substantially coherent. Furthermore the adjustment unit 90-1, 90-2, ..., 90-N is adapted to impose a receive compensation 200Rx-1, 200Rx-2, ..., 200Rx-N onto receive signal from individual ones of the transceiver units 20-1, 20-2, ..., 20-N. The receive compensations 200Rx-1, 200Rx-2, ..., 200Rx-N comprise a receive phase compensation, a receive amplitude compensation and a receive delay compensation. The receive compensation 200Rx-1, 200Rx-2, ..., 200Rx-N will substantially compensate the receive deviations Rx-1, Rx-2, ..., Rx-N as measured by the measurement unit 150 in order to yield a coherent reception of the active antenna array 1.

It is one option to measure amplitude deviations as part of the transmit deviations Tx-1, Tx-2, ..., Tx-N and/or the receive deviations Rx-1, Rx-2, ..., Rx-N by inserting power meters (not shown). The power meters may be situated in the transceiver units 20-1, 20-2, ..., 20-N, the central base band processing unit 10 or along the feedback paths 110-1, 110-2, ..., 110-N. The use of power meters, for example, Varactor diodes has been disclosed in the related patent applications of the applicant U.S. patent application Ser. No. 12/577,339.

It will be appreciated that a measurement of phase deviations within the transmit deviations Tx-1, Tx-2, ..., Tx-N and/or the receive deviations Rx-1, Rx-2, ..., Rx-N is required in order to be able to perform a phase calibration for the active antenna array 1. The measurements of the phase deviations may either be performed on the payload signals P-1, P-2, ..., P-N or by injecting a dedicated pilot signal. The dedicated pilot signal has specific properties that allow a measurement of the phase deviations between the individual ones of the transceiver units 20-1, 20-2, ..., 20-N, for example specific correlation properties for the individual payload signal P-1, P-2, ..., P-N being relayed by the individual one of the transceiver units 20-1, 20-2, ..., 20-N. Hence the individual payload signal P-1, P-2, ..., P-N may be recognised by the specific correlation properties in order to identify individual ones of the transceiver units 20-1, 20-2, ..., 20-N. The amplitude deviations and the phase deviations may be compensated by multiplying complex valued payload signals P-1, P-2, ..., P-N with an appropriate complex factor. The complex multiplication can be formed in the central base band processing unit 10 as depicted in FIG. 5.

Figure 6:
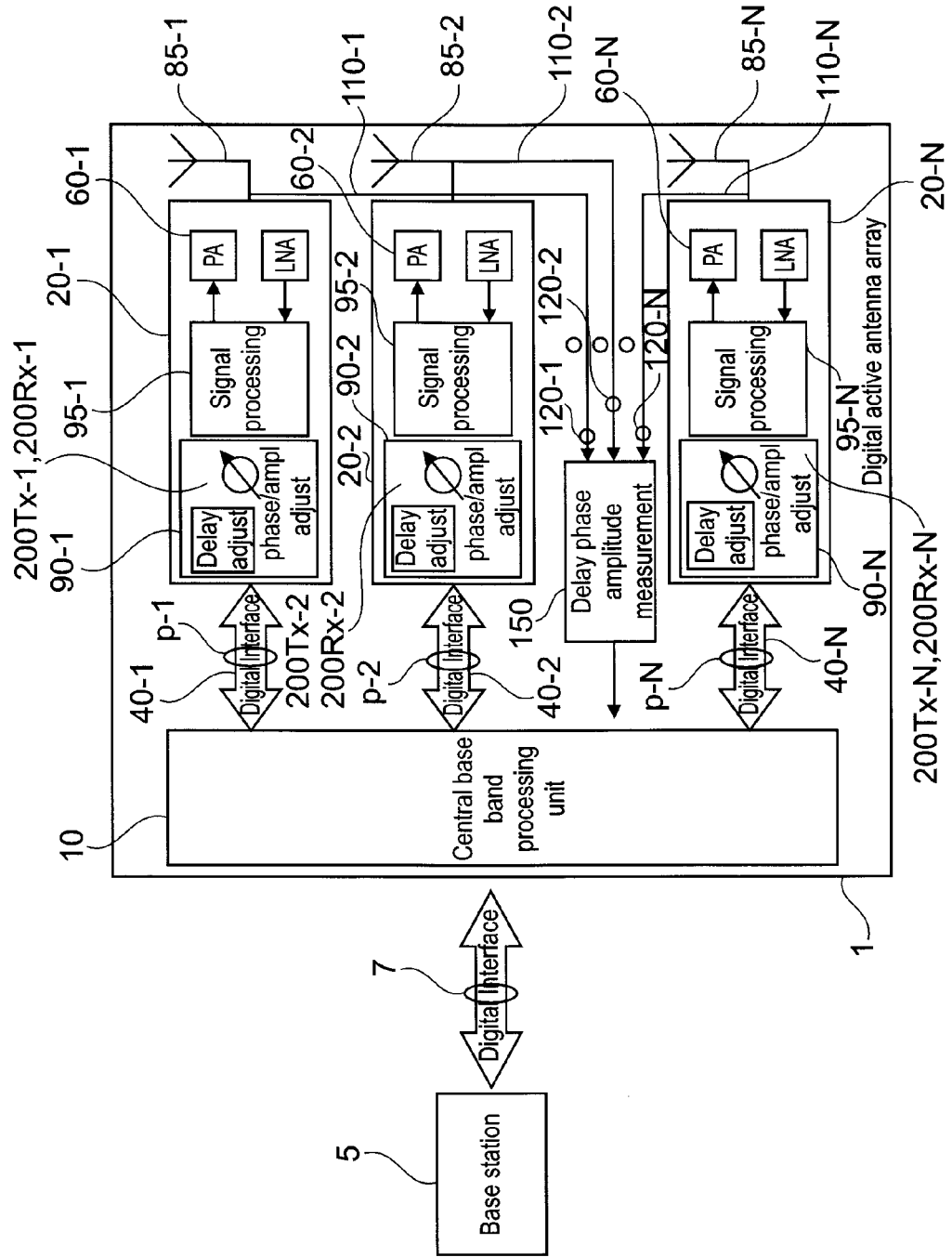
FIG. 6 shows another aspect of the active antenna array comprising the feedback path.

Alternatively the phase compensation and the amplitude compensation may be performed independently for each one of the transceiver units 20-1, 20-2, ..., 20-N as is shown in FIG. 6. In FIG. 6 the adjustment units 90-1, 90-2, ..., 90-N were moved from the central base band unit 10 to each one of the transceiver units 20-1, 20-2, ..., 20-N.

A further option for the transmit amplitude compensation is to vary analogue gains of the transmit amplifiers 60-1, 60-2, ..., 60-N of individual ones of the transceiver units 20-1, 20-2, ..., 20-N for the transmit amplitude compensation. In the case of the receive amplitude compensation an analogue gain of the receive amplifier 70-1, 70-2, ..., 70-N may be varied for individual receive amplifiers 70-1, 70-2, ..., 70-N in order to achieve the receive amplitude compensation in the receive case.

In order to compensate phase deviations of the transmit deviations and/or the receive deviations Tx-1, Tx-2, ..., Tx-N, Rx-1, Rx-2, ..., Rx-N, analogue phase shifting circuits may be used in the analogue transmit amplifiers 60-1, 60-2, ..., 60-N or the analogue receive amplifiers 70-1, 70-2, ..., 70-N.

It will be noted that the transmit deviations Tx-1, Tx-2, ..., Tx-N and/or the receive deviations Rx-1, Rx-2, ..., Rx-N may be frequency dependent. Ideally the signal paths on the transceiver units 20-1, 20-2, ..., 20-N would show a substantially "flat" frequency behaviour in their transfer characteristics of the signals. Hence the phase measurement and the amplitude measurement would not be frequency dependent. In such an ideal case of the "flat" transfer characteristics of the transceiver units 20-1, 20-2, ..., 20-N and a perfect time alignment between individual ones of the transceiver units 20-1, 20-2, ..., 20-N, it would be sufficient to measure the phase deviations and the amplitude deviations at a single frequency.

Figure 7:
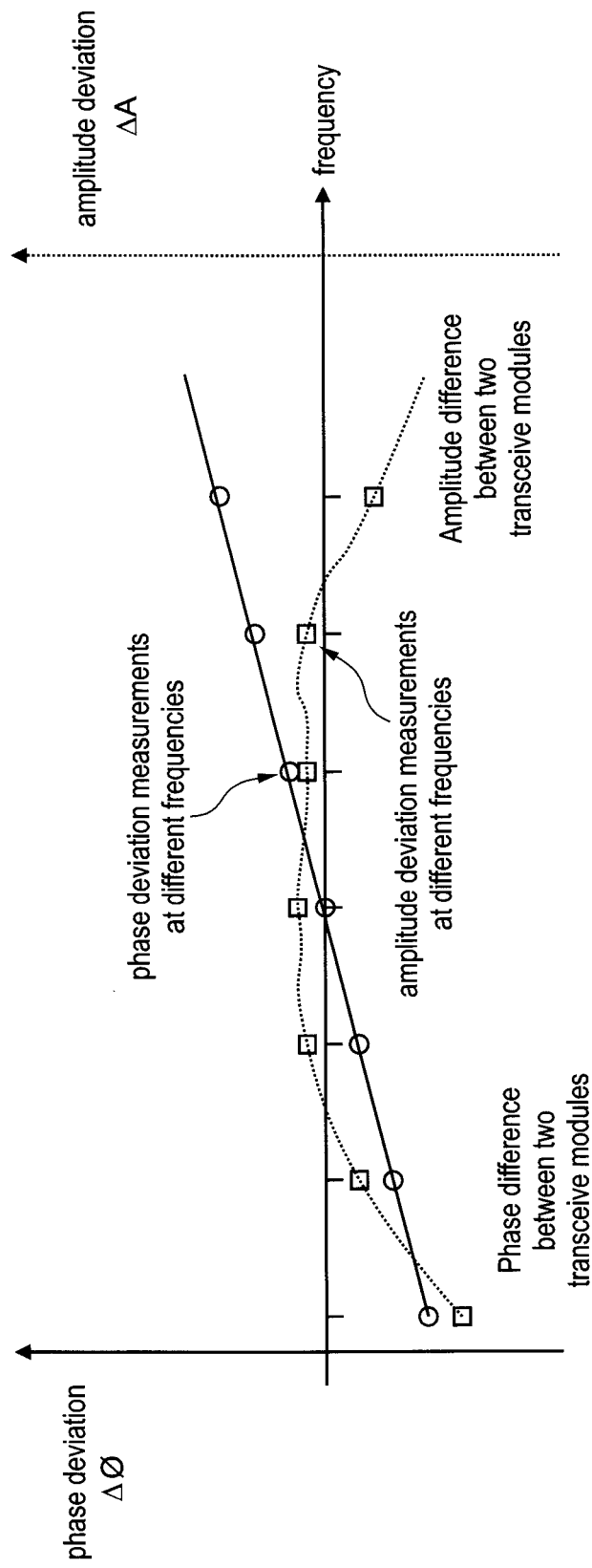
FIG. 7 shows a measurement of amplitude deviations and phase deviations at discrete frequencies.

In a real system this condition of "flat" transfer characteristics is typically not fulfilled with respect to frequency. Signal transfer characteristics in the transmit direction and/or the receive direction may substantially deviate from the "flat behaviour". It is then of interest to measure phase deviations and amplitude deviations at different frequency points as shown in FIG. 7. The open circles indicate phase deviations between individual ones of the transceiver units 20-1, 20-2, ..., 20-N over frequency. The phase deviations within the transmit deviations Tx-1, Tx-2, ..., Tx-N and the receive deviations Rx-1, Rx-2, ..., Rx-N are not flat as indicated by the solid straight line. The solid straight line actually indicates an interpolation between the frequencies at which the phase deviation was actually measured (open circles, left y-axis). Likewise the amplitude deviations within the transmit deviations Tx-1, Tx-2, ..., Tx-N or the receive deviations Rx-1, Rx-2, ..., Rx-N can be measured at several frequencies as indicated by the open squares (corresponding to the right y-axis) within FIG. 7 between the measured values for the amplitude deviation.

One may face situations in which a bandwidth of the payload signals P-1, P-2, ..., P-N is small. Should the frequency dependence of the amplitude deviations and/or the phase deviations between individual ones of the transceiver units 20-1, 20-2, ..., 20-N be rather broad compared to the bandwidth of the payload signal P-1, P-2, ..., P-N, it may be sufficient to perform the phase corrections and/or the amplitude corrections for the phase deviations and the amplitude deviations with respect to a centre frequency of the payload signal P-1, P-2, ..., P-N. More precisely, the amplitude and phase compensations may be derived by a correction term only depending on the centre frequency of the payload signal P-1, P-2, ..., P-N. A correction of the phase and amplitude measurements at different frequencies (as shown in FIG. 7) can be achieved using the correction term and the centre frequency.

If the amplitude and phase transfer characteristic of the transceiver units 20-1, 20-2, ..., 20-N show a significant variation inside a bandwidth of the payload signal P-1, P-2, ..., P-N, a different scheme for the phase and/or amplitude compensation may be applied. In the transmit direction an in-band compensation scheme can be realised using a pre-emphasis unit 135. The pre-distortion unit 135 uses the result of the frequency-dependent phase and amplitude deviation as discussed with respect to FIG. 7 to pre-distort the individual payload signals P-1, P-2, ..., P-N prior to a transmission in order to obtain a substantially "flat" amplitude characteristic and a substantially linear phase variation over frequency at the antenna elements 85-1, 85-2, ..., 85-N. The pre-distortion unit 135 could be implemented in the central base band processing unit 10 or alternatively at the transceiver unit 20-1, 20-2, ..., 20-N for each one of the transceiver units.

Figure 8:
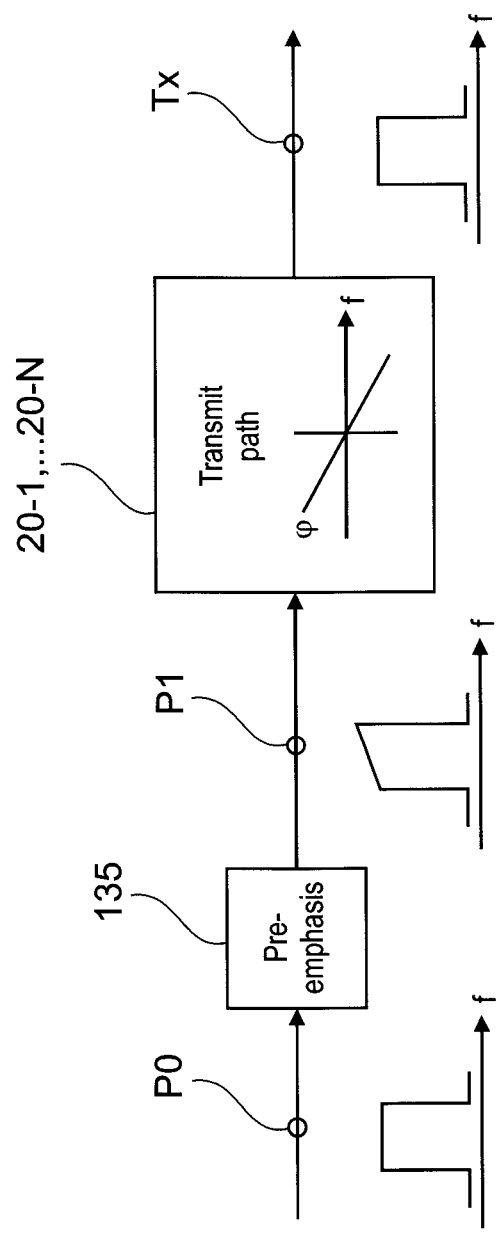
FIG. 8 shows a concept of pre-emphasis for in-band transmit phase compensation.

In FIG. 8 a signal P0 having a substantially "flat" variation of the phase over frequency enters the pre-emphasis unit 135 from the left. The pre-emphasis unit 135 adds a linear increase in phase over frequency to the signal P0 thereby forming a pre-emphasis signal P1. The pre-emphasised signal P1 enters the transmit path of the transceiver unit 20-1, 20-2, ..., 20-N. The pre-emphasised signal P1 comprises such a variation in phase over frequency that it "inverts" the phase deviations within the transmit deviations Tx-1, Tx-2, ..., Tx-N; thus producing a substantially "flat" transmit signal Tx with respect to a variation of the phase over frequency.

Figure 9:
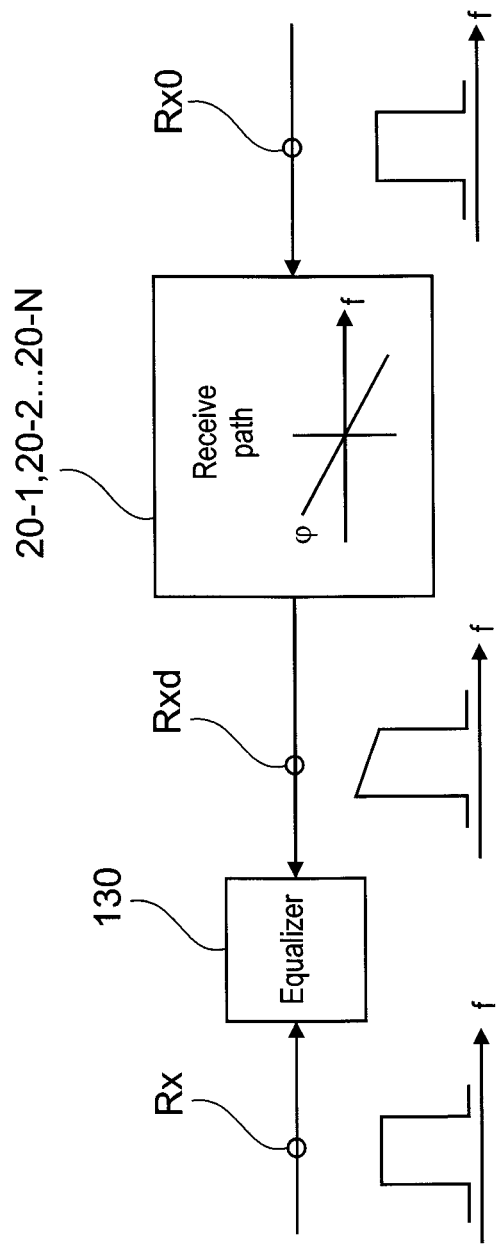
FIG. 9 shows an equalization for in-band receive phase compensation.

In the receive direction an inverse compensation scheme can be implemented based on an equaliser. FIG. 9 shows an in-band receive phase compensation comprising an equaliser 130. A receive signal with a substantially "flat" phase deviation over frequency enters the transceiver units 20-1, 20-2, ..., 20-N from the right. The transceiver units 20-1, 20-2, ..., 20-N impose a frequency dependent phase variation onto the receive signal Rx. A distorted receive signal Rxd comprising a substantially linear decrease in phase over frequency will be present at a receive output of the transceiver unit 20-1, 20-2, ..., 20-N. The equalizer 130 may correct for the phase deviations in the receive deviations Rx-1, Rx-2, ..., Rx-N in order to provide an undistorted receive signal comprising the substantially "flat" transfer characteristic of phase over frequency.

The equalizer 130 may be present within the transceiver units 20-1, 20-2, ..., 20-N or the central base band processing unit 10.

The present disclosure further relates to a method 1000 for relaying radio signals in a mobile communications network.

Figure 10:
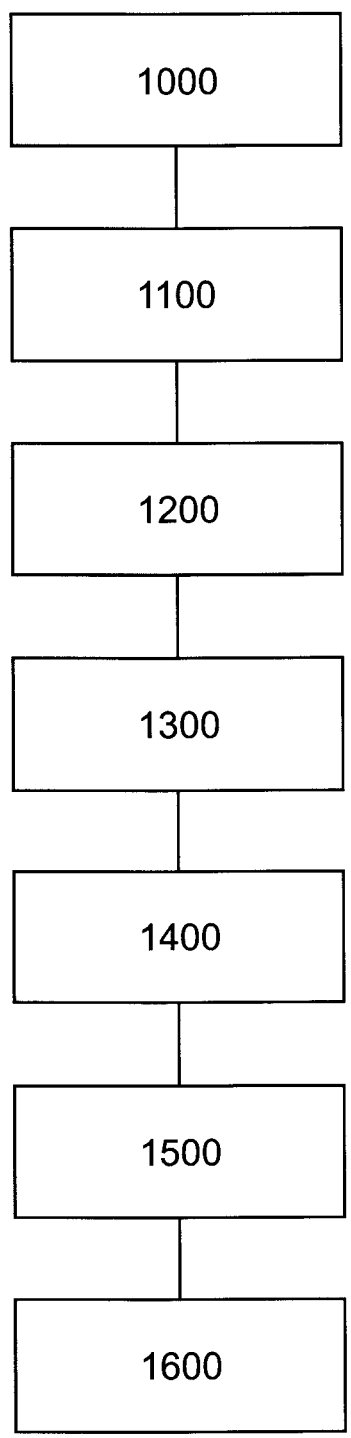
FIG. 10 shows a diagram of a method of relaying radio signal.

FIG. 10 shows a flow diagram of the method 1000. A step 1100 comprises a generating of a global timing signal T. The global timing signal T is at a fixed timing rate Tr. The global timing signal T is generated in response to a base station signal 7 from a base station 5. The global timing signal T is generated by detecting the rising and/or falling edges of a signal component within the base station signal 7 as discussed above.

In a step 1200 the global timing signal T is embedded in at least one payload signal P-1, P-2, ..., P-N. In a step 1300 the payload signal P-1, P-2, ..., P-N is forwarded over the link 40-1, 40-2, ..., 40-N.

In a step 1400 a local timing signal T-1, T-2, ..., T-N is extracted from the payload signals P-1, P-2, ..., P-N at the transceiver units 20-1, 20-2, ..., 20-N. The global timing signal T is used for the extracting 1400 of the local timing signal T-1, T-2, ..., T-N.

A step 1500 comprises a compensating of deviations between individual ones of the transceiver units 20-1, 20-2, ..., 20-N. The step 1600 comprises a relaying of the payload signal P-1, P-2, ..., P-N according to an individual one of the local timing signals T-1, T-2, ..., T-N. The selectable payload rate Pr is selectable independently from the fixed timing rate Tr.

It is to be understood that a temporal order of data packets reaching the central base band processing unit 10 is not preserved when the payload signals P-1, P-2, ..., P-N are relayed over the links 40-1, 40-2, ..., 40-N. The relaying across the link 40-1, 40-2, ..., 40-N may comprise a burst-type relaying at the individual transceiver unit 20-1, 20-2, ..., 20-N. The temporal order of the data packets is restored using the local timing signals T-1, T-2, ..., T-N (see FIGS. 3 and 4).

Figure 11:
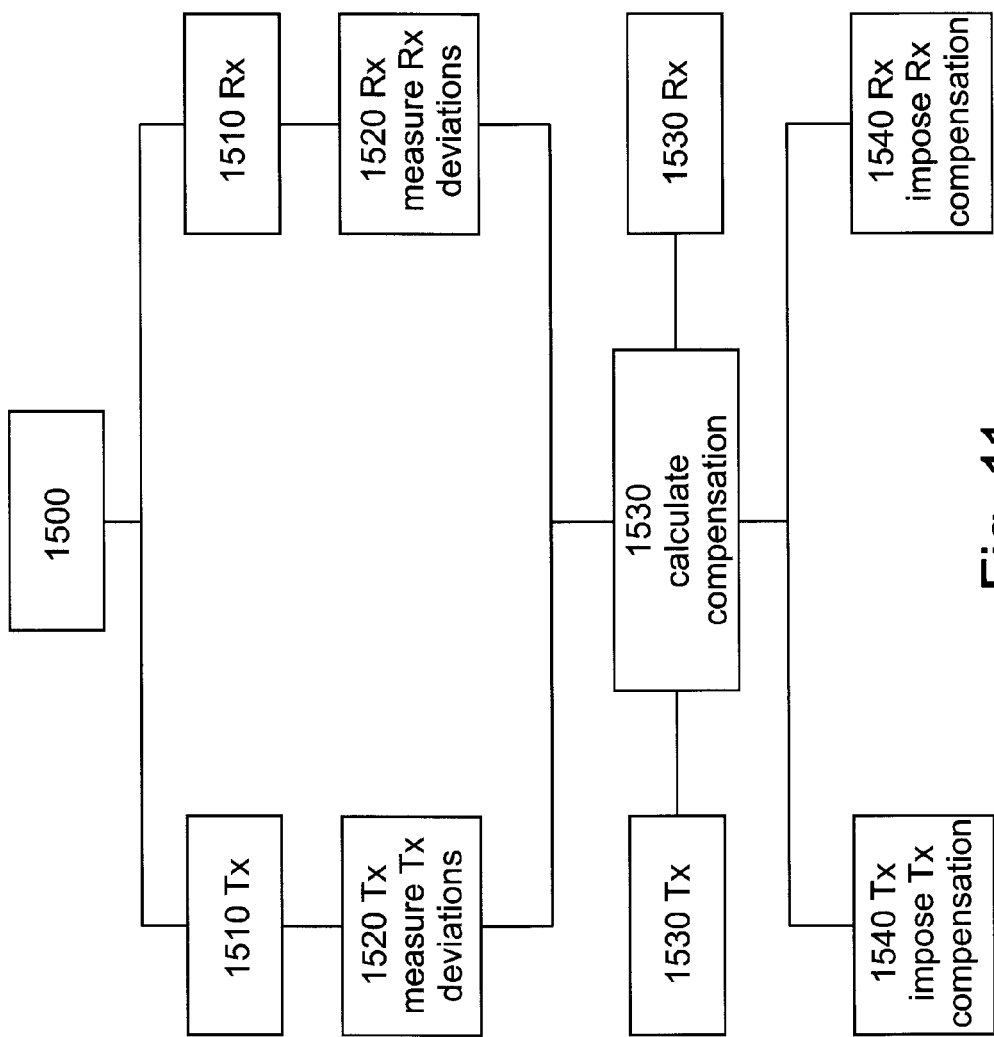
FIG. 11 shows a diagram of a step of compensating deviations.

FIG. 11 shows details of the compensating 1500 of deviations between the individual ones of the transceiver units. The step 1500 comprises method steps related to a compensation of transmit deviations on the left hand side. Corresponding steps of the compensating 1500 are shown in the compensating of receive deviations on the right hand side. Let us consider the transmit case first. In a step 1510Tx a coupled transmit signal 120Tx-1, 120Tx-2, ..., 120Tx-N is extracted, for example, close to the active antenna elements 85-1, 85-2, ..., 85-N. The directional coupler may be used for the extracting 1510 Tx of the coupled transmit signal 120Tx-1, 120Tx-2, ..., 120Tx-N. In a step 1520 Tx transmit deviations Tx-1, Tx-2, ..., Tx-N are measured. The measuring may be carried out using the measurement unit 150.

In the receive case the method starts with a step 1510 Rx of extracting a coupled receive signal 120Rx-1, 120Rx-2, ..., 120Rx-N. It is to be understood that the coupled transmit signal 120Tx-1, 120Tx-2, ..., 120Tx-N and/or the coupled receive signals 120Rx-1, 120Rx-2, ..., 120Rx-N may be extracted for each one of the transceiver units 20-1, 20-2, ..., 20-N or only for a selected group of the transceiver units 20-1, 20-2, ..., 20-N.

A step 1520Rx comprises a measuring of receive deviations Rx-1, Rx-2, ..., Rx-N between individual ones of the coupled receive signal 120Rx-1, 120Rx-2, ..., 120Rx-N and the at least one payload signal P-1, P-2, ..., P-N. Typically, the receive deviations Rx-1, Rx-2, ..., Rx-N are measured between the coupled receive signals 120Rx-1, 120Rx-2, ..., 120Rx-N and the payload signal P-1, P-2, ..., P-N of identical ones of the transceiver units 20-1, 20-2, ..., 20-N.

A step 1530 comprises a calculating of compensations. In the transmit case the step 1530 comprises the calculating 1530Tx of transmit compensations 200Tx-1, 200Tx-2, ..., 200Tx-N. The transmit compensations 200Tx-1, 200Tx-2, ..., 200Tx-N comprise transmit phase compensations, transmit amplitudes compensations, transmit delay compensations. The calculating 1530Tx may generate frequency-dependent correction terms for the pre-emphasis unit 135 as discussed with respect to FIG. 7.

In the receive case the step 1530 comprises a calculating 1530Rx of receive compensation 200Rx-1, 200Rx-2, ..., 200Rx-N. The calculating 1530Rx of the receive compensation may comprise a frequency-dependent compensation achieved by providing correction terms for the equaliser 130 as discussed with respect to FIG. 9. The receive compensations 200Rx-1, 200Rx-2, ..., 200Rx-N comprise a phase receive compensation, an amplitude receive compensation, a delay receive compensation. The calculating 1530Rx is based on the measuring 1520Rx of receive deviations Rx-1, Rx-2, ..., Rx-N, possibly comprising the frequency dependent measurement and interpolation as discussed with respect to FIG. 7.

A step 1540Tx comprises an imposing of transmit compensations 200Tx-1, 200Tx-2, ..., 200Tx-N onto the payload signal P-1, P-2, ..., P-N in order to compensate for any of the transmit deviations Tx-1, Tx-2, ..., Tx-N, as depicted in FIG. 8.

A step 1540Rx comprises an imposing of receive compensations 200Rx-1, 200Rx-2, ..., 200Rx-N onto receive signals in order to compensate for any of the receive deviations Rx-1, Rx-2, ..., Rx-N, for example, using the equalizer 130, as depicted in FIG. 9.

A step 1540Rx comprises an imposing of receive compensations 200Rx-1, 200Rx-2, ..., 200Rx-N onto receive signals received at the individual antenna elements 85-1, 85-2, ..., 85-N.

The step 1500 may be carried out for an individual one of the transceiver units 20-1, 20-2, ..., 20-N at a time or for more than one of the transceiver units 20-1, 20-2, ..., 20-N concurrently. It is to be understood that the step 1500 is only depicted for one of the transceiver units 20-1, 20-2, ..., 20-N and there might be several iterations of the step 1500 required in order to fully compensate deviations between the individual ones of the transceiver units 20-1, 20-2, ..., 20-N.

The method 1000 provides a substantially coherent relaying of the active antenna array 1 comprising the digital links 40-1, 40-2, ..., 40-N adapted to relay the payload signal P-1, P-2, ..., P-N at an adjustable payload rate Pr.

The present disclosure further teaches a computer program product comprising a non-transitory computer useable medium having a control logic stored therein for causing a computer to manufacture the active antenna array 1 for a mobile communications network of the present disclosure.

The present disclosure further relates to a computer program product comprising a non-transitory computer useable medium having control logics stored therein for causing a computer to relay radio signal in a mobile communications network as discussed with the method 1000 for relaying radio signals in a mobile communications network of the present disclosure.

While various embodiments of the present invention have been described above, it should be understood that they have been presented by way of example, and not limitation. It will be apparent to persons skilled in the relevant arts that various changes in form and detail can be made therein without departing from the scope of the invention. In addition to using hardware (e.g., within or coupled to a Central Processing Unit ("CPU"), microprocessor, microcontroller, digital signal processor, processor core, System on Chip ("SOC"), or any other device), implementations may also be embodied in software (e.g., computer readable code, program code, and/or instructions disposed in any form, such as source, object or machine language) disposed, for example, in a non-transitory computer usable (e.g., readable) medium configured to store the software. Such software can enable, for example, the function, fabrication, modelling, simulation, description and/or testing of the apparatus and methods described herein. For example, this can be accomplished through the use of general programming languages (e.g., C, C++), hardware description languages (HDL) including Verilog HDL, VHDL, and so on, or other available programs. Such software can be disposed in any known non-transitory computer usable medium such as semiconductor, magnetic disk, or optical disc (e.g., CD-ROM, DVD-ROM, etc.). The software can also be disposed as a computer data signal embodied in a computer usable (e.g., readable) transmission medium (e.g., carrier wave or any other medium including digital, optical, or analog-based medium). Embodiments of the present invention may include methods of providing the apparatus described herein by providing software describing the apparatus and subsequently transmitting the software as a computer data signal over a communication network including the Internet and intranets.

It is understood that the apparatus and method described herein may be included in a semiconductor intellectual property core, such as a microprocessor core (e.g., embodied in HDL) and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

| Reference numerals | |
|---|---|
| 1a | active antenna array |
| 5 | base station |
| 7 | base station signal |
| 10 | central base band processing unit |
| 20-1, 20-2, ..., 20-N | transceiver units |
| 25 | duplexer |
| 25-1, 25-2, ..., 25-N | duplex filters |
| 40-1, 40-2, ..., 40-N | link |
| 50 | central clocking unit |
| 60-1, 60-2, ..., 60-N | transmit amplifier |
| 70-1, 70-2, ..., 70-N | receive amplifier |
| 85-1, 85-2, ..., 85-N | active antenna elements |
| 90-1, 90-2, ..., 90-N | adjustment units |
| 95-1, 95-2, ..., 95-N | processing elements |
| 110-1, 110-2, ..., 110-N | feedback path to a measurement unit |
| 120-1, 120-2, ..., 120-N | feedback signal |
| 120Tx-1, 120Tx-2, ..., 120Tx-N | coupled transmit signal |
| 120Rx-1, 120Rx-2, ..., 120Rx-N | coupled receive signal |
| 150 | measurement unit |
| 200Tx-1, 200Tx-2, ..., 200Tx-N | transmit compensations |
| 200Rx-1, 200Rx-2, ..., 200Rx-N | receive compensations |
| Tx-1, Tx-2, ..., Tx-N | transmit deviations |
| Rx-1, Rx-2, ..., Rx-N | receive deviations |
| P-1, P-2, ..., P-N | payload signal |
| T-1, T-2, ..., T-N | local timing signals |

The invention claimed is:

1. An active antenna array for a mobile communications network, the active antenna array comprising:
   a base band unit coupled to a base station; the base band unit comprising a central clocking unit providing a timing signal in response to a base station signal received from the base station
   a plurality of transceiver units, wherein individual ones of the plurality of transceiver units are terminated by at least one antenna element;
   a plurality of links coupling the individual ones of the plurality of transceiver units to the base band unit; wherein an individual link of the plurality of links is a digital link and relays an individual payload signal at an individual selectable payload rate and further relays the timing signal at a fixed timing rate, the timing signal being embedded in the payload signal at the individual selectable payload rate, wherein the payload rate of the individual payload signals is variable along the plurality of links and is selectable independently from the fixed timing rate;
   a plurality of local timing units located in the individual ones of the plurality of transceiver units, wherein the local timing units extract a local timing signal in response to the timing signal from the embedded payload signals for synchronizing the plurality of transceiver units to the central clocking unit.

2. The active antenna array according to claim 1, wherein the at least one link is adapted to relay the payload signal using a variable packet length.

3. The active antenna array according to claim 1, comprising:
   a plurality of transmit amplifiers for amplifying transmit signals transmitted by individual ones of the transceiver units.

4. The active antenna array according to claim 1, comprising:
   a plurality of receive amplifiers for amplifying receive signals received by individual ones of the transceiver units.

5. The active antenna array according to claim 1, comprising:
   at least one adjustment unit adapted to apply at least one of a variable delay, a variable phase weighting and a variable amplitude weighting to a signal passing an individual one of the links.

6. The active antenna array according to claim 1, comprising:
   at least one processing element for signal processing within an individual one of the transceiver units, the at least one processing element being selected from the group consisting of: a digital filtering element, an analogue filtering element, a duplex filter, a digital to analogue converter, an analogue to digital converter, an equalizer and a mixer.

7. The active antenna array according to claim 1, comprising:
   at least one feedback path from an individual one of the antenna elements to a measurement unit; the feedback path relaying a feedback signal, the feedback signal comprising at least one of one or more coupled transmit signals being coupled from signals transmitted by the individual one of the antenna elements or one or more coupled receive signals being coupled from signals received by the individual one of the antenna elements.

8. The active antenna array according to claim 7, the measurement unit being adapted to:
   measure a transmit deviation accumulated when transmitting using an individual one of the transceiver units;
   wherein the transmit deviation comprises at least one of an amplitude deviation, a phase deviation and a delay deviation.

9. The active antenna array according to claim 7, the measurement unit being adapted to:
   measure a receive deviation accumulated when receiving using an individual one of the transceiver units;
   wherein the receive deviation comprises at least one of an amplitude deviation, a phase deviation and a delay deviation.

10. A method for relaying radio signals in a mobile communications network, the method comprising:
    generating, by a central clocking unit, a global timing signal at a fixed timing rate in response to a base station signal received from a base station;
    embedding the global timing signal in at least one payload signal at a selectable payload rate;
    forwarding the at least one payload signal at the selectable payload rate over at least one link of a plurality of links, the at least one link being a digital link, the selectable payload rate being variable along the plurality of links;
    extracting, by a plurality of local timing units, at least one local timing signal for at least one transceiver unit from the global timing signal which is embedded in the at least one payload signal at the selectable payload rate; and
    relaying the at least one payload signal according to an individual one of the local timing signals;
    wherein the selectable payload rate is selectable independently from the fixed timing rate.

11. The method according to claim 10, further comprising:
    compensating deviations between individual ones of the transceiver units.

12. The method according to claim 11, the compensating comprising:
    extracting a coupled transmit signal;
    measuring transmit deviations between individual ones of the coupled transmit signals and the at least one payload signal;
    calculating transmit compensations; and
    imposing transmit compensations.

13. The method according to claim 11, the compensating comprising:
    extracting a coupled receive signal;
    measuring receive deviations between individual ones of the coupled receive signals and the at least one payload signal;
    calculating receive compensations; and
    imposing receive compensations.

14. A computer program product comprising a non-transitory computer usable medium having control logic stored therein for causing a computer to manufacture an active antenna array for a mobile communications network, the active antenna array comprising:
    a base band unit coupled to a base station, the base band unit comprising a central clocking unit providing the timing signal in response to a base station signal received from the base station;
    a plurality of transceiver units terminated by at least one antenna element;
    at least one link coupling the individual ones of the plurality of transceiver units to the base band unit; wherein the at least one link is a digital link and relays a payload signal at a selectable payload rate and a timing signal at a fixed timing rate, the timing signal being embedded in the payload signal at the selectable payload rate and wherein the payload rate of the individual payload signals is selectable independently from the fixed timing rate and is variable along the plurality of links;
    a plurality of local timing units located in the individual ones of the plurality of transceiver units, the plurality of local timing units extracting a local timing signal in response to the timing signal from the embedded payload signals for synchronizing the plurality of transceiver units to the central clocking unit.

15. A computer program product comprising a non-transitory computer usable medium having control logic stored therein for causing a computer to relay radio signals in a mobile communications network, the control logic comprising:
    means for causing the computer to generate a global timing signal at a fixed timing rate in response to a payload signal received from a base station;
    means for causing the computer to embed the global timing signal in at least one payload signal at a selectable payload rate;
    means for causing the computer to forward the at least one payload signal over at least one link of a plurality of links;
    means for causing the computer to extract at least one local timing signal for at least one transceiver unit from the global timing signal; and
    means for causing the computer to relay the at least one payload signal according to an individual one of the local timing signals;
    wherein the selectable payload rate is selectable independently from the fixed timing rate and the selectable payload rate is variable along the plurality of links.

\* \* \* \* \*